United States Patent
Tyler et al.

(10) Patent No.: US 8,694,148 B2
(45) Date of Patent: Apr. 8, 2014

(54) TRACKING AND MARKING SPECIMENS HAVING DEFECTS FORMED DURING LASER VIA DRILLING

(75) Inventors: Michael Tyler, Hillsboro, OR (US); Robert W. Colby, N. Franklin, CT (US); Jeffrey W. Leonard, Portland, OR (US); Lindsey M. Dotson, Portland, OR (US); David A. Watt, Newark, CA (US); Cris E. Hill, Portland, OR (US); Laura H. Campbell, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1216 days.

(21) Appl. No.: 11/719,390

(22) PCT Filed: Nov. 14, 2005

(86) PCT No.: PCT/US2005/041218
§ 371 (c)(1),
(2), (4) Date: Mar. 8, 2011

(87) PCT Pub. No.: WO2006/053300
PCT Pub. Date: May 18, 2006

(65) Prior Publication Data
US 2011/0208343 A1    Aug. 25, 2011

Related U.S. Application Data

(60) Provisional application No. 60/628,278, filed on Nov. 15, 2004.

(51) Int. Cl.
*G06F 19/00*    (2011.01)
*G01R 31/00*    (2006.01)

(52) U.S. Cl.
USPC ........... 700/166; 700/108; 700/115; 700/121; 324/500; 324/512; 324/537; 324/759.02

(58) Field of Classification Search
USPC .......... 700/108, 110, 115, 121, 166; 324/500, 324/512, 537, 750.01, 750.15, 750.18, 324/759.02
See application file for complete search history.

(56) References Cited

U.S. PATENT DOCUMENTS

| | | |
|---|---|---|
| 4,870,244 A | 9/1989 | Copley et al. |
| 5,170,063 A | 12/1992 | Miyazaki et al. |
| 5,847,960 A | 12/1998 | Cutler et al. |
| 6,433,301 B1 | 8/2002 | Dunsky et al. |
| 7,062,399 B1 * | 6/2006 | Bruce et al. .................. 702/117 |
| 2001/0047880 A1 | 12/2001 | Abbott et al. |
| 2002/0117481 A1 | 8/2002 | Unrath et al. |
| 2003/0068833 A1 * | 4/2003 | Atkinson et al. .................. 438/7 |
| 2004/0159636 A1 | 8/2004 | Sandstrom et al. |

FOREIGN PATENT DOCUMENTS

| | | |
|---|---|---|
| JP | 2002144059 | 5/2002 |
| JP | 2003500220 | 1/2003 |

* cited by examiner

*Primary Examiner* — Sean Shechtman
(74) *Attorney, Agent, or Firm* — Stoel Rives LLP

(57) ABSTRACT

A method and system increase processed specimen yield in the laser processing of target material that includes multiple specimens formed on a common substrate. Preferred embodiments implement a feature that enables storage in the laser processing system a list of defective specimens that have somehow been subject to error during laser processing. Once the common substrate has been completely processed, the system alerts an operator to the number of improperly processed specimens and gives the operator an opportunity to run a software routine, which in a preferred embodiment uses a laser to scribe a mark on the top surface of each improperly processed specimen.

18 Claims, 2 Drawing Sheets

TRACKING AND MARKING SPECIMENS HAVING DEFECTS FORMED DURING LASER VIA DRILLING

RELATED APPLICATIONS

This application is a 371 of International Application No. PCT/US2005/041218, filed Nov. 14, 2005, which claims benefit of U.S. Provisional Patent Application No. 60/628,278, filed Nov. 15, 2004.

TECHNICAL FIELD

This invention relates to laser drilling of vias in target material characterized by repetitive patterns and, in particular, to a technique for increasing integrated circuit (IC) package yield by tracking and marking IC packages arranged on a common panel and having defective vias formed during a laser via drilling process.

BACKGROUND INFORMATION

Nominally identical IC packages are typically arranged in multiple arrays on a common panel. FIG. 1 shows by way of example a panel 2 of which eighty IC packages 4 are arranged in four quadrants 6 of twenty IC packages each. (The "X" mark across each of three of the IC packages represents a defect indication made in accordance with the invention and forms no part of the prior art.) A typical panel is a multi-layer structure composed of a resin-based material, such as ABF, and patterned layers of an electrically conductive material, such as copper. Laser drilling forms a blind via in the ABF material to a depth at which a copper layer is present to enable formation of a via interconnect between different layers of an IC package. (In a subsequent step, copper in a gaseous state plates the holes to complete the interconnect.)

The state of the art in laser drilling is to stop a laser drilling process promptly upon detection of an error occurring during drilling. After drilling has been stopped, an operator removes and discards the entire panel on which the drilling error appears in typically only several IC packages. The reason for discarding the entire panel is that there is no currently available way to identify where on the panel an error has occurred. The present invention substantially reduces the number of IC packages that are unaffected by a drilling error but are rendered as scrap because of their presence on a discarded panel on which a recoverable error had occurred somewhere. A recoverable error is an error after the occurrence of which a laser drilling system could still continue processing.

SUMMARY OF THE INVENTION

Preferred embodiments of this invention are adapted for implementation in software running on currently available laser drilling systems and enable the tracking and marking of recoverable errors on a panel of IC packages during a laser drilling process. Although its implementation is described for IC packages, the tracking and marking technique (hereafter "X-Out feature") is applicable to any laser drilling domain in which patterns are repeated on a material (e.g., high density interconnect (HDI) and flexible (Flex) circuits).

The X-Out feature enables storage in the laser drilling system a list of defective IC packages or patterns that have somehow been misdrilled during laser via drilling processing. Once a panel has been completely drilled, the system alerts an operator to the number of misdrilled IC packages and gives the operator an opportunity to run an X-Out routine, which in a preferred embodiment uses the laser to scribe an "X" through the top surface of each misdrilled IC package identified. This process of physically marking defective packages or patterns not only identifies exactly which of the IC packages on the panel are defective, but also creates a physical mark (X) on the panel for easy identification. Neither defective IC package identification nor specifically identified IC package marking is available in the prior art. These defective IC packages can then be discarded when the panel is diced, thereby allowing the remaining IC packages of the panel to be saved. Since a typical panel might have between 100 and 300 IC packages, identifying a few defective IC packages enables the customer to save between about 97%-99% of its panel.

The X-Out feature is specifically implemented in software and firmware that allow the laser drilling system to track which ones of the vias were misdrilled when a recoverable error occurred. Examples of sources of recoverable errors include out-of-tolerance laser power, panel positioning stage offset, and laser beam-directing galvanometer offset. The software then causes storage of this information until the system has completed drilling. Once drilling is complete, the software algorithmically correlates the misdrilled vias to specific IC packages or patterns on the panel. An "X" is then scribed in the top surface of these IC packages or patterns using a scalable toolpath file. An extension of this technology entails allowing a customer to specify its own X-Out mark. An example of a customized X-Out mark would be a proprietary toolpath designed to make the specific package or pattern fail electrical testing. Such an X-Out mark would enable the customer to track and identify defective IC packages without human inspection of them.

Additional objects and advantages of this invention will be apparent from the following detailed description of preferred embodiments thereof which proceed with reference to the accompanying drawings.

DETAILED DESCRIPTION OF PREFERRED EMBODIMENTS

An exemplary laser drilling system on which preferred embodiments of the X-Out feature are implemented is a Model 5530 Laser Drill, manufactured by Electro Scientific Industries, Inc., the assignee of this patent application. The Model 5530 laser drilling system and its predecessor systems do not support a via tracking mechanism. Thus, during drilling, the Model 5530 pauses after encountering a recoverable error condition. Although the pause is taken to minimize the amount of damage done to the panel, there is no mechanism available to identify the affected sections of the panel. The problem causing the error is diagnosed and repaired, but the entire panel is scrapped to ensure that no defective IC package is propagated forward in the customer's production line. The preferred embodiments implement in the Model 5530 system (and may be implemented in other laser drilling systems) an indexing mechanism that is used to trace a path of relative movement (i.e., a sequence of move commands) between the laser beam and the panel to enable identification of a location where a recoverable error has occurred.

Figure 2:
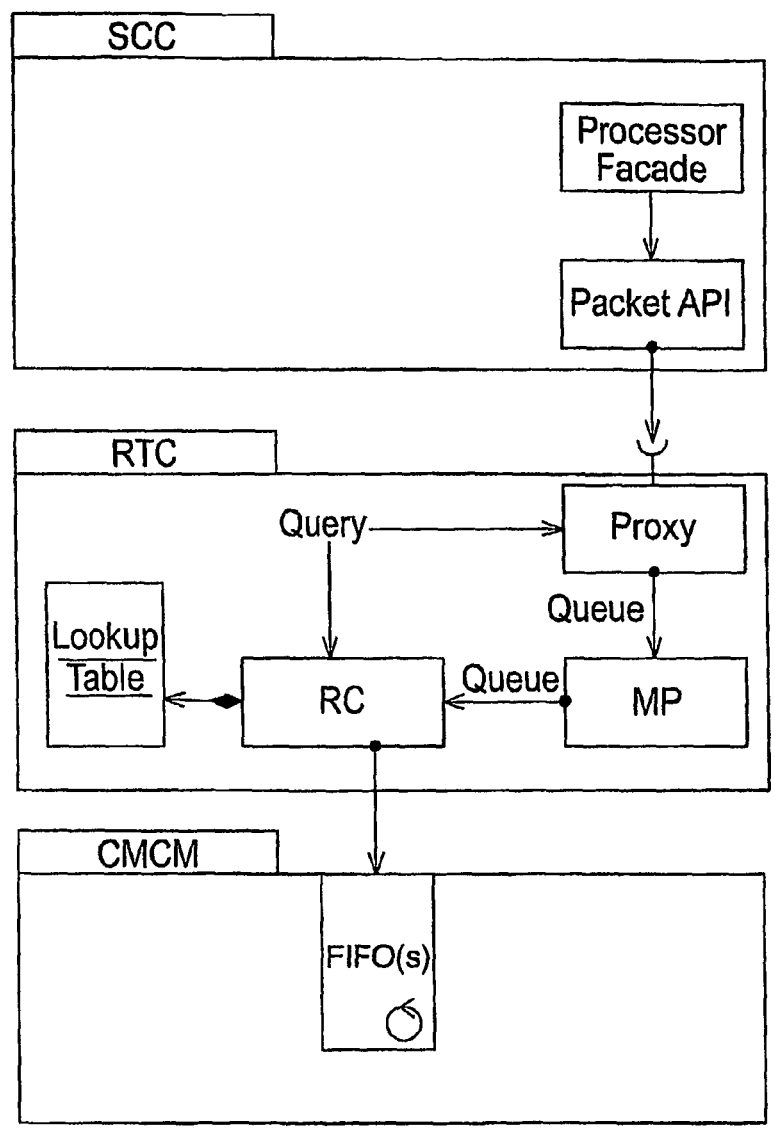
FIG. 2 is a simplified block diagram of the computer architecture of an exemplary laser drilling system in which the present invention is implemented.

With reference to FIG. 2, a laser drilling system 10, such as the Model 5530, includes a system control computer (SCC) 12, a real-time control computer (RTC) 14, and coordinated motion control modules (CMCM) 16. SCC 12 stores a profile of move commands that are carried out by a positioning mechanism, which in response to CMCM 16 effects relative movement between a laser beam and a reference datum associated with panel 2. The move commands direct the laser beam to stored locations on panel 2 where instances of via drilling are to take place. Via tracking is accomplished by creating a hole count for each set of move commands passed down through a real-time control module (RC) 20 of RTC 14 to CMCM 16. In a first embodiment, the hole count, together with a corresponding sum of dT (incremental time change) values at each move command, is stored in a look-up table (LUT) 22 in RTC 14. This provides traceability back from the move commands to via count and thereby enables an ability to track, within an acceptable error tolerance, which of the vias was drilled when a recoverable error condition occurred. The sum of dT values at each move command stored in LUT 22 is provided by a register added to CMCM 16, which maintains a running sum of the dT values it receives.

The system implemented with the indexing method in accordance with the first embodiment operates as follows. During system operation, CMCM 16 produces and sends to SCC 12 a recoverable error message signal to pause operation. CMCM 16 latches in a register the move time (sum of dT values) at which the recoverable error message occurs. An operator causes laser drilling to resume until the next operational pause or the completion of panel processing. SCC 12 then activates a panel recovery operation in which the profile of the move commands is correlated with the hole count information stored in LUT 22 to determine the position of the laser drill head at the time of each pause. SCC 12 provides instructions to activate existing marker software to scribe an "X" mark on each IC package 4 in which a recoverable error occurred. Marker software can be adapted to scale the size of an "X" mark or set its position anywhere on panel 2 within the above-mentioned tracking error tolerance range.

Figure 1:
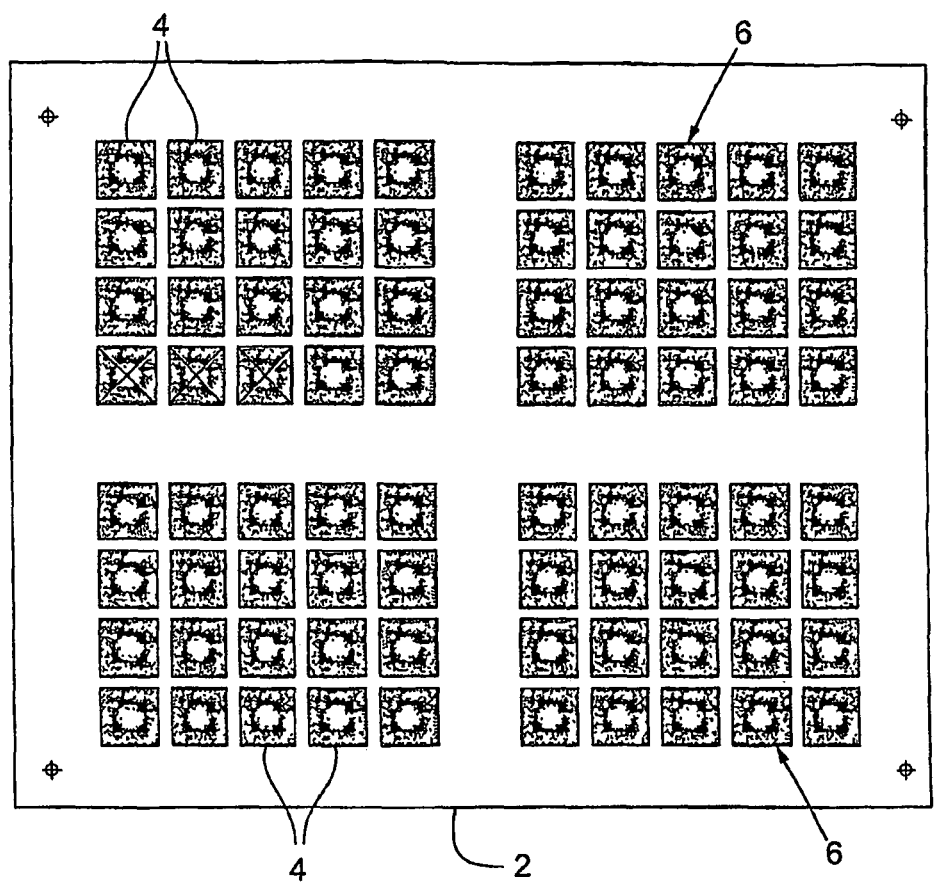
FIG. 1 is a pictorial view of a panel of which eighty IC packages are arranged in four quadrants of twenty IC packages each, and of which three of the IC packages in the upper left-hand side quadrant are marked with an X-Out feature formed in accordance with the invention.

Skilled persons will appreciate that there is typically a time lag from when a recoverable error-causing condition of system operation occurs and the time of an operational pause. Several IC packages 4 may, therefore, be damaged as a consequence of this time lag. FIG. 1 shows three adjacent IC packages 4 scribed with "X" marks to represent the impact of the laser error condition that results from a delay of operational pause.

In a second embodiment, the hole count for each set of move commands is not used in association with a corresponding sum of dT values at each move command. Instead, after CMCM 16 produces a recoverable error message, SCC 12 pauses operation, determines the location at which panel processing stopped, and determines the locations of the processed vies nearest to the stopping location. Software implemented in SCC 12 enables an option of automatic, without operator intervention, or operator-caused resumption of laser drilling until the next operational pause or the completion of panel processing. SCC 12 thereafter operates as described with reference to the first embodiment, examining backward and forward in the sequence of move commands to identify potentially damaged IC packages.

A third embodiment represents a more sophisticated implementation of via tracking that includes using a via position index correlated with each move command time. The via position index is returned to SCC 12 whenever a recoverable error message occurs to provide immediate information about the position of the laser drill head at the time of occurrence of the error. (The first embodiment described above uses cumulative move time information, which undergoes a review process to determine via location.)

A preferred implementation of the preferred embodiments entails addition of executable instructions and firmware but no additional hardware.

It will be obvious to those having skill in the art that many changes may be made to the details of the above-described embodiments of this invention without departing from the underlying principles thereof. The scope of the present invention should, therefore, be determined only by the following claims.

The invention claimed is:

1. A method of increasing processed specimen yield in the laser micromachining processing of target material that includes multiple specimens formed on a common substrate, comprising:

forming in a location of memory storage a record of relative movement between a laser beam and the common substrate;

forming a record of laser micromachining processing of the target material for the relative movement;

producing a recoverable error indication in response to an occurrence of a recoverable error condition detected during the laser micromachining processing; and correlating the record of relative movement and the record of laser micromachining processing to determine which operation of laser micromachining processing took place when a recoverable error condition occurred.

2. The method of claim 1, in which the record of laser micromachining processing includes a time indication associated with each operation of laser micromachining processing, the producing of a recoverable error indication includes assigning a time indication to the recoverable error indication, and the correlating includes matching within an error tolerance the time indication of occurrence of a recoverable error to a closest-in-time operation of laser micromachining processing.

3. The method of claim 1, in which the record of relative movement includes a sequence of move commands.

4. The method of claim 1, in which the multiple specimens include repetitive patterns.

5. The method of claim 4, in which the repetitive patterns represent those of high density interconnect (HDI) or flexible (Flex) circuits.

6. The method of claim 1, in which the multiple specimens include multiple packages.

7. The method of claim 6, in which the multiple packages are integrated circuit packages.

8. The method of claim 1, further comprising providing on the common substrate a mark indicating the specimen to which a recoverable error indication corresponds.

9. The method of claim 8, in which the mark is placed on the specimen.

10. The method of claim 8, in which the specimen includes electrical circuitry and the specimen fails electrical testing because of the mark.

11. The method of claim 1, in which the laser micromachining processing includes removing a portion of the target material.

12. The method of claim 11, in which the removing of a portion of the target material includes via drilling.

13. A system implemented to effect increased processed specimen yield in the laser micromachining processing of target material that includes multiple specimens formed on a common substrate, comprising:
- a movement controller in response to a system control computer initiating relative movement between a laser beam and the common substrate;
- a command subsystem operating to generate information relating to a path of relative movement between the laser beam and the common substrate;
- memory for recording laser micromachining processing taking place at specific positions along the path of the relative movement; and
- an error signal generator producing a recoverable error indication signal in response to an occurrence of a recoverable error condition and initiating recording of positions along the path of the relative movement that correspond to the occurrence of a recoverable error condition, thereby to identify and enable separation from the common substrate each of the specimens undergoing laser micromachining processing during the recoverable error condition.

14. The system of claim 13, in which the system control computer, in response to the recoverable error indication signal, causes a laser beam to form on the common substrate a mark indicating each specimen to which the recoverable error indication signal corresponds.

15. The system of claim 13, in which the information relating to a path of relative movement includes a sequence of move commands.

16. The system of claim 13, further comprising an instruction signal causing placement of a mark indicating the specimen to which a recoverable error indication signal corresponds.

17. The system of claim 16, in which the mark is placed on the specimen.

18. The system of claim 16, in which the specimen includes electrical circuitry and the specimen fails electrical testing because of the mark.

* * * * *